United States Patent [19]

Yeatts

[11] Patent Number: 4,946,563
[45] Date of Patent: Aug. 7, 1990

[54] PROCESS FOR MANUFACTURING A SELECTIVE PLATED BOARD FOR SURFACE MOUNT COMPONENTS

[75] Inventor: Alfred T. Yeatts, Effingham, S.C.

[73] Assignee: General Electric Company, Lynchburg, Va.

[21] Appl. No.: 282,630

[22] Filed: Dec. 12, 1988

[51] Int. Cl.$^5$ .......................... H05K 3/34; C25D 5/05
[52] U.S. Cl. .......................................... 204/15; 29/840;
29/852; 156/659.1; 156/902; 174/263; 174/264;
428/901
[58] Field of Search .................. 174/68.5, 263, 264;
29/852, 840; 156/902, 659.1; 427/96; 428/901;
204/15

[56] References Cited

U.S. PATENT DOCUMENTS

| | | |
|---|---|---|
| 3,418,422 | 12/1968 | Bradham, III ................. 174/68.5 X |
| 3,427,181 | 2/1969 | Lowery et al. . |
| 3,480,412 | 11/1969 | Duffek, Jr. et al. ........... 174/68.5 X |
| 3,673,680 | 7/1972 | Tanaka et al. ..................... 204/15 X |
| 4,024,631 | 5/1977 | Castillero . |
| 4,075,416 | 2/1978 | Küttner et al. .................... 174/68.5 |
| 4,075,757 | 2/1978 | Malm et al. . |
| 4,081,601 | 3/1978 | Dinella et al. ..................... 174/68.5 |
| 4,082,908 | 4/1978 | Vanaglash, Jr. . |
| 4,154,877 | 5/1979 | Vratny . |
| 4,237,607 | 12/1980 | Ohno ............................... 174/68.5 X |
| 4,325,780 | 4/1982 | Schulz, Sr. ...................... 156/659.1 |
| 4,337,091 | 6/1982 | El-Shazly et al. . |
| 4,444,619 | 4/1984 | O'Hara ......................... 156/659.1 X |
| 4,465,742 | 8/1984 | Nagashima et al. . |
| 4,487,654 | 12/1984 | Coppin ................................. 156/645 |
| 4,503,131 | 3/1985 | Baudrand . |
| 4,572,925 | 2/1986 | Scarlett ............................. 29/852 X |
| 4,608,274 | 8/1986 | Wooten . |
| 4,720,324 | 1/1988 | Hayward .......................... 29/852 X |
| 4,735,694 | 4/1988 | Kukanskis ............................ 204/15 |
| 4,756,795 | 7/1988 | Bakos et al. . |
| 4,790,902 | 12/1988 | Wada et al. ........................ 204/15 X |
| 4,804,615 | 2/1989 | Larson et al. ..................... 204/15 X |

Primary Examiner—Carl E. Hall
Assistant Examiner—Carl J. Arbes
Attorney, Agent, or Firm—Nixon & Vanderhye

[57] ABSTRACT

A printed circuit board manufacturing process is disclosed which provides good solderability, a non-reflowable coating under the solder mask, and provides a completely uniform flat surface for surface mount components. An electroplated tin/nickel surface is disposed on a copper coated circuit board. Rather than maintaining the solderability of the tin/nickel by immediately coating the surface with gold, a solder mask first is disposed on the electroplated nickel. The solder mask serves the dual role of identifying the conductivity and soldering points and also identifying those selected areas for coating with gold. Thereafter, a very thin and closely controlled layer of gold is disposed on the activated tin/nickel using a non-autocatalytic immersion process to selectively apply gold only to areas open for conductivity or solderability.

19 Claims, 1 Drawing Sheet

PROCESS FOR MANUFACTURING A SELECTIVE PLATED BOARD FOR SURFACE MOUNT COMPONENTS

FIELD OF THE INVENTION

This invention generally relates to a process for manufacturing printed circuit boards. More particularly, this invention relates to a process for manufacturing a printed circuit board that is designed to provide a uniformly flat plated surface for optimally mounting surface mount components thereon.

BACKGROUND AND SUMMARY OF THE INVENTION

In order to simplify printed circuit assembly operations using surface mount components, it is highly desirable that the printed circuit board have a uniformly flat mounting surface. When, fabricating, for example, a mobile or portable radio, aluminum or zinc alloy castings are typically surface mounted on the printed circuit board along with other components.

Serious problems may result if such components are not properly mounted on the circuit board. For example, if the castings are not mounted on a conductive surface which is uniformly flat, the radio is likely to suffer from high frequency leakage resulting in significant noise being generated.

If the surface on which the surface mount components are disposed is not completely flat, variations in chip pad heights typically result. Variations in chip pad heights in turn result in some components not even coming in contact with the adhesive which is automatically disposed on the printed circuit board during assembly processing to hold components in place prior to soldering operations.

In one prior art approach to manufacturing printed circuit boards for surface mount components, a printed circuit board is coated with copper to provide the necessary circuit board conductivity. In order to provide solderability to the circuit board, a tin/nickel surface is disposed over the copper.

In this prior art approach, in order to retain the solderability of the tin/nickel, gold is electroplated over the entire tin/nickel surface at a thickness on the order of 20–50 millionths of an inch. This process has several disadvantages. Initially, it is noted that this technique is very expensive since the entire tin/nickel surface i gold plated. In this regard, using known electroplating techniques, it is very difficult to closely control the thickness of the gold that is plated on the tin/nickel surface. Additionally, a solder joint tends to become highly embrittled if the gold, which is highly soluble in molten solder, rises to a level of 4% of the constituency of solder joint.

In order to avoid the expense of coating the circuit board with gold, another circuit board manufacturing technique has been utilized which involves electroplating the copper coated board with a tin/lead or other reflowable coating. The tin/lead coating is applied to coat the copper covered circuit board in order to retain its solderability. In order to retain the solderability of the tin/lead, the tin/lead is reflowed (which begins to occur at about 360°).

Although solderability of the tin/lead coating is effectively retained through the use of reflowable coatings, a non-uniform surface for surface mount components results from such processing. In this approach, a solder mask is then disposed over the tin/lead coating so as to leave openings at the points where soldering is required.

Due to the non-uniform surface resulting from the reflowed coating, chip pads to be soldered to the circuit board are not evenly disposed on a flat surface. As a result of the uneven disposition of the chip pads, it is very difficult to properly solder the surface mount components onto the circuit board.

Such difficulties result in the component mounting and circuit board assembly process being a more labor intensive process thereby increasing manufacturing costs. Additionally, due to the non-uniform mounting surface, chips tend to be mounted in a skewed fashion and the circuit board reject rate tends to rise due to poor soldering connection.

Another prior art printed circuit board manufacturing technique which has been utilized involves both tin/lead electroplating and hot air leveling. In this technique, the circuit board is plated with copper and then tin/lead. After the board is etched to define the components which are to be mounted, the tin/lead is chemically stripped to the copper surface. Thereafter, a solder mask is placed on the circuit board to define the soldering points.

After exposing the board to solder, a hot air knife is utilized to blow excess solder out of the through holes and other unwanted portions of the circuit board while the solder is still molten. Using this technique, a reflowable coating still is found underneath the component chips. Accordingly, this technique fails to solve the above-mentioned problems in the art resulting from a non-uniform mounting surface.

The present invention is directed to a circuit board manufacturing process that retains good solderability over time using a non-reflowable coating under the solder mask. The process described herein results in a circuit board having a completely uniform flat surface for surface mount components.

In accordance with the present invention, an electroplated tin/nickel surface is disposed on a copper coated circuit board. Rather than maintaining the solderability of the tin/nickel by immediately coating the surface with gold, a solder mask is first disposed on the electroplated tin/nickel. The solder mask serves the dual role of identifying the soldering points as well as identifying those areas to be coated with gold. Thereafter, the tin/nickel coating is activated and a very thin and closely controlled layer of gold is disposed on the activated tin/nickel using a non-autocatalytic immersion process to selectively apply gold only to areas open for conductivity or solderability.

In this fashion, the present invention advantageously avoids using gold to coat the entire tin/nickel layer which is disposed under the solder mask and additionally avoids utilizing a reflowable coating. A non-autocatalytic immersion process is utilized so that the gold thickness is carefully controlled to be in the range of around 0.000002 to 0.000003 inches. By so limiting the thickness of gold, there is no possibility of embrittling the soldered joint by allowing too much gold to solubilize into the joint and to alloy with the tin/lead soldering compound.

BRIEF DESCRIPTION OF THE DRAWINGS

These as well as other objects and advantages of this invention will be better appreciated by reading the following detailed description of the presently preferred exemplary embodiment taken in conjunction with the accompanying drawing of which.

DETAILED DESCRIPTION OF THE PREFERRED EMBODIMENT

Figure 1:
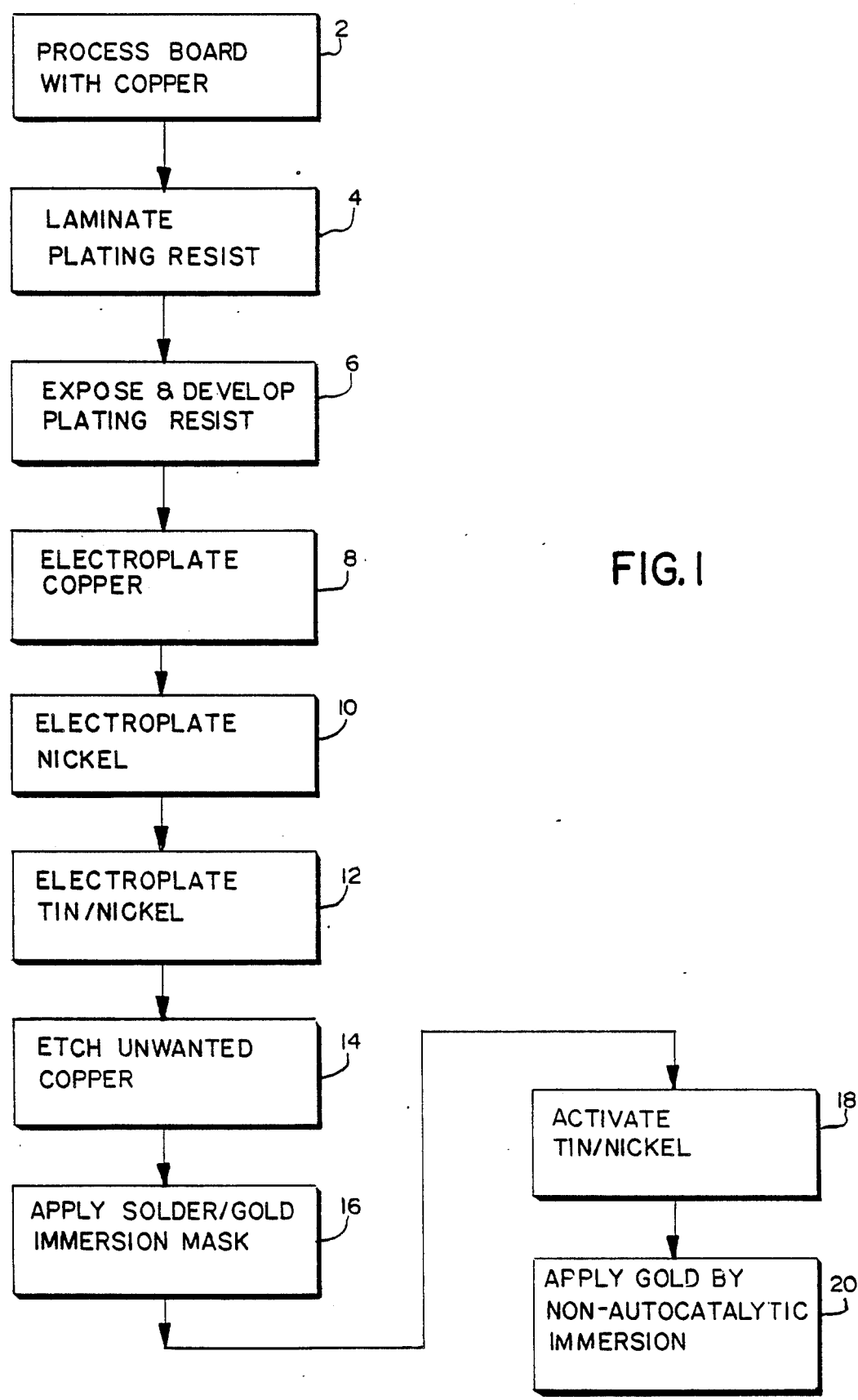
FIG. 1 is a flow diagram of a circuit board manufacturing process in accordance with an exemplary embodiment of the present invention.

Turning to FIG. 1, a printed circuit board of conventional epoxy glass construction, prior to being coated with copper, is drilled to provide through holes into which the leads from components to be mounted on the board may be inserted. The holes allow for conductivity to be maintained from one side of the circuit board to the other. Thereafter, a deburring operation is performed to eliminate burrs associated with the drilling.

After the deburring processing, the printed circuit board is treated via an electroless copper coating step (2) to deposit a thin layer of copper on the board and in the through holes to thereby establish conductivity from one side of the board to the other. By coating all exposed surfaces with electroless copper, such surfaces may be subsequently electroplated.

Thereafter, a plating resist on the order of 0.0015 inches thick is laminated onto the board (4). The photosensitive resist may be applied via a conventional hot roll laminater to thereby coat the entire outer copper surface.

Ultraviolet light is then directed through a film which serves as a mask to precisely define the disposition of the circuitry which is to be disposed on the board to insure, for example, that the circuitry is properly aligned with the through holes. The dark areas on the film correspond to photoresist areas on the circuit board to be removed and the light areas on the film correspond to the circuitry to be maintained on the board. Upon exposure to the ultraviolet light source, the plating resist develops to thereby image the desired circuit configuration (6).

By utilizing a potassium or sodium carbonate solution, the unwanted photoresist areas are then removed. In this fashion, the resist is removed from those portions of the circuit board which are to be electroplated.

The board is then placed in an electroplating line to electroplate additional copper on the exposed copper (8). As is conventional, the board is cleaned, rinsed, and exposed to an acid dip. Thereafter, the board is placed in an electroplating tank to build up the copper plating to approximately a 0.001 inch thickness which is difficult to obtain using only electroless copper processing.

In the prior art, after electroplating with copper, the circuit board is typically placed in a tin/lead bath. Instead, in accordance with the present invention, the circuit board is placed in a nickel bath and nickel is electroplated onto the circuit board in order to reduce "sliver" problems (10). In this regard, prior art techniques have suffered from problems due to slivers of the etchant causing shorts. By electroplating with a highly ductile material such as nickel, the tendency for slivers to be created is reduced. In the exemplary embodiment, the nickel is electroplated to a thickness of 0.00015 inches.

Thereafter, the board is electroplated with a non-reflowable tin/nickel coating having a thickness of around 0.00005 inches (12). As will be appreciated by those skilled in the art, the tin/nickel coating may be electroplated in the manner described on pages 7-25, 7-26 of the *Printed Circuits Handbook*, by Coombs, copyright 1979. The tin/nickel coating serves to retain the solderability of the board. Additionally, the tin/nickel surface provides a non-reflowable coating which insures a uniform flat surface for mounting surface mount components. By avoiding an uneven mounting surface, the assembly process is less difficult and the ultimate printed circuit board rejection rate due to poor soldering connections is reduced.

In conventional processes, using a tin/nickel coating, the tin/nickel surface is completely coated with gold to retain its solderability. In accordance with the present invention, an etching step is performed to remove copper from the board in all areas of the board, except where tin/nickel is present (14). In this regard, an etchant is used to which the tin/nickel is resistant and therefore the tin/nickel remains intact. In this fashion, a non-conductive surface is present everywhere on the board except where there is a tin/nickel surface.

Thereafter, a solder mask is applied to the board (16). The solder mask is placed on the board to insure that soldering will only take place in those areas where soldering connections need be made. The solder mask insures that two leads will not be inadvertently soldered together.

Additionally, in accordance with the present invention, the solder mask is also utilized as a gold immersion mask for the gold immersion processing step to be described below. By using the solder mask during the gold immersion processing, significant savings are realized in that a reduced amount of gold is utilized when compared to the prior art gold electroplating technique described above.

The solder/gold immersion mask may be applied to the board using laminating techniques whereby the mask is exposed and developed in a similar fashion to the photoresist processing described above. Alternatively, the mask may be applied using a screening technique where the mask is disposed on the board only in those places where it is desired to remain.

After the solder mask has been applied, the tin/nickel is activated (118). In this regard, a 50% hydrochloric acid solution is applied to the tin/nickel. The activation of the tin/nickel by the hydrochloric acid permits gold to be thereafter applied. Additionally, this activation step enhances the tin/nickel solderability. In this regard, it is noted that the processing steps involved in applying the solder/gold immersion mask tends to passivate the tin/nickel.

After the exposed tin/nickel is activated, gold is applied to the exposed tin/nickel by a non-autocatalytic immersion process (20). The board is dipped in a gold bath to generate an oxidation reduction reaction that causes the gold to adhere to the tin/nickel. Once the gold covers all the exposed tin/nickel, the deposition process stops. Due to the presence of the mask, tin/nickel is only exposed at the points where it is desired to solder. Accordingly, gold is only deposited at those points.

Advantageously, the oxidation reduction reaction stops after only 0.000002 inches to 0.000003 inches of gold is deposited. The thickness of the gold is limited due to the fact that the gold will not deposit on itself. In this regard, the deposition process is such that gold is only deposited on material (i.e., the tin/nickel) which is at a predetermined potential difference from the potential of the bath. Accordingly, due to the self-limiting nature of the non-autocatalytic immersion deposition process, the amount of gold that is deposited is not critically dependent upon the skill of an operator and therefore may be very accurately controlled. By accurately controlling the gold thickness to be in the above-mentioned range the possibility of embrittling the solder joint by allowing more than 4% gold in the soldered joint is eliminated.

Additionally, since soldering occurs on the active tin/nickel there is no problem with the loss of solderability over time. In this regard, in prior art systems using a tin/lead coating, a copper/tin/lead interface forms over time causing a loss of solderability. After a circuit board is fabricated in accordance with the present invention, its solderability is indefinitely retained thereby facilitating repairs which must be made many years after manufacturing.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A process for manufacturing a printed circuit board for surface mount components comprising the steps of:
    disposing a non-reflowable coating on the circuit board for retaining the solderability of the circuit board;
    applying, after said non-reflowable coating has been disposed on said circuit board, a solder mask to the circuit board having said non-reflowable coating thereon, said applying step including the steps of identifying the points to be soldered with said solder mask and identifying the areas to be coated with a precious metal with said solder mask; and
    applying said precious metal to only those areas of the non-reflowable coating which are exposed by the solder mask.

2. A process for manufacturing a printed circuit board for surface mount components comprising the steps of:
    disposing a non-reflowable coating on the circuit board for retaining the solderability of the circuit board;
    applying, after said non-reflowable coating has been disposed on said circuit board, a solder mask to the circuit board having said non-reflowable coating thereon, said applying step including the steps of identifying the points to be soldered with said solder mask and identifying the areas to be coated with a precious metal with said solder mask; and
    applying said precious metal to only those areas of the tin/nickel coating which are exposed by the solder mask, wherein said disposing step includes the step of electroplating a tin/nickel coating on said circuit board.

3. A process according to claim 1, wherein said step of applying a precious metal includes the step of applying gold to the non-reflowable coating using non-autocatalytic immersion.

4. A process according to claim 1 wherein said step of applying a precious metal includes the step of applying gold to the non-reflowable coating at a thickness of less than 0.000003 inches.

5. A process for manufacturing a printed circuit board for surface mount components comprising the steps of:
    disposing a non-reflowable coating on the circuit board for retaining the solderability of the circuit board;
    applying, after said non-reflowable coating has been disposed on said circuit board, a solder mask to the circuit board having said non-reflowable coating thereon, said applying step including the steps of identifying the points to be soldered with said solder mask and identifying the areas to be coated with a precious metal with said solder mask; and
    applying said precious metal to only those areas of the non-reflowable coating which are exposed by the solder mask, further including the steps of plating the circuit board with copper, and
    removing the copper from those areas of the board not covered by using the non-reflowable coating as an etch resist.

6. A process according to claim 1, further comprising the step of disposing a highly ductile material on the circuit board prior to the step of disposing a non-reflowable coating on the board.

7. A process for manufacturing a printed circuit board for surface mount components comprising the steps of:
    disposing a non-reflowable coating over the nickel on the circuit board for retaining the solderability of the circuit board;
    applying, after said non-reflowable coating has been disposed on said circuit board, a solder mask to the circuit board having said non-reflowable coating thereon, said applying step including the steps of identifying the points to be soldered with said solder mask and identifying the areas to be coated with a precious metal with said solder mask; and
    applying said precious metal to only those areas of the non-reflowable coating which are exposed by the solder mask, further comprising the step of disposing a highly ductile material on the circuit board prior to the step of disposing a non-reflowable coating on the board, wherein said disposing a highly ductile material includes the step of electroplating nickel on said board.

8. A process according to claim 1, further including the step of activating the non-reflowable coating prior to the step of applying the precious metal.

9. A process for manufacturing a printed circuit board for surface mount components comprising the steps of:
    disposing a tin/nickel coating on the circuit board for retaining the solderability of the circuit board and for providing a non-reflowable coating to said circuit board;
    applying, after said tin/nickel coating has been disposed on said board, a mask to the circuit board; and
    using said mask as a mask for selectively soldering on only predetermined areas of said board and as a mask for selectively applying a precious metal to only certain areas of said tin/nickel coating, whereby a printed circuit board is fabricated with a uniformly flat surface.

10. A process according to claim 9, wherein said step of disposing includes the step of electroplating said tin/nickel coating on said circuit board.

11. A process according to claim 9, further including the step of selectively applying gold to only certain areas of said tin/nickel coating using non-autocatalytic immersion.

12. A process according to claim 11, wherein said step of applying gold includes the step of applying gold to the tin/nickel coating at a thickness of less than 0.000004 inches.

13. A process according to claim 9, further including the steps of plating the circuit board with copper, and
removing the copper from those areas of the board not covered by the tin/nickel coating by using the tin/nickel coating as an etch resist.

14. A process according to claim 9, further comprising the step of disposing a highly ductile material on the circuit board prior to the step of disposing the tin/nickel coating on the board.

15. A process according to claim 14 wherein said step of disposing a highly ductile material includes the step of electroplating nickel on said board.

16. A process according to claim 9, further including the step of activating the tin/nickel coating prior to applying the precious metal.

17. A method for retaining solderability of a coating comprising the steps of:
disposing a non-reflowable coating on a predetermined surface for retaining the solderability of said predetermined surface;
applying, after said non-reflowable coating has been disposed on said predetermined surface, a mask to said non-reflowable coating, said applying step including the steps of identifying the points to be soldered with said solder mask and identifying the areas to be coated with a precious metal with said solder mask;
applying a precious metal to only those areas of the non-reflowable coating which are exposed by the mask.

18. A method for retaining solderability of a coating comprising the steps of:
electroplating a non-reflowable coating on a predetermined surface for retaining the solderability of said predetermined surface;
applying, after said non-reflowable coating has been disposed on said predetermined surface, a solder mask to said tin/nickel coating, said applying step including the steps of identifying the points to be soldered with said solder mask and identifying the areas to be coated with a precious metal with said solder mask; and
applying a precious metal to only those areas of the tin/nickel coating which are exposed by the solder mask, wherein said disposing step includes the step of electroplating a tin/nickel coating on said predetermined surface 19. A method according to claim 17, wherein said step of applying a precious metal includes the step of applying gold to the non-reflowable coating using non-autocatalytic immersion.

* * * * *